(12) United States Patent
Hung et al.

(10) Patent No.: US 10,840,437 B2
(45) Date of Patent: Nov. 17, 2020

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Wen Hung, Tainan (TW); Yu-Ping Wang, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 1 day.

(21) Appl. No.: 15/996,524

(22) Filed: Jun. 4, 2018

(65) Prior Publication Data

US 2019/0341544 A1 Nov. 7, 2019

(30) Foreign Application Priority Data

May 7, 2018 (CN) .......................... 2018 1 0425128

(51) Int. Cl.
| | |
|---|---|
| *H01L 43/08* | (2006.01) |
| *H01L 43/12* | (2006.01) |
| *H01L 27/22* | (2006.01) |
| *H01L 43/02* | (2006.01) |
| *H01L 43/10* | (2006.01) |

(52) U.S. Cl.
CPC ............ *H01L 43/08* (2013.01); *H01L 27/222* (2013.01); *H01L 43/02* (2013.01); *H01L 43/12* (2013.01); *H01L 43/10* (2013.01)

(58) Field of Classification Search
CPC ....... H01L 43/08; H01L 43/12; H01L 27/222; H01L 43/02; H01L 43/10; H01L 27/228; G11C 11/161
See application file for complete search history.

(56) References Cited

U.S. PATENT DOCUMENTS

| | | | |
|---|---|---|---|
| 9,614,143 B2 * | 4/2017 | Lu | .......................... H01L 27/222 |
| 10,069,064 B1 * | 9/2018 | Haq | ...................... H01L 27/222 |
| 2010/0240151 A1 * | 9/2010 | Belen | ...................... H01L 43/12 438/3 |
| 2012/0063216 A1 * | 3/2012 | Fujita | ................... G11C 11/1659 365/158 |
| 2017/0104029 A1 * | 4/2017 | Li | .......................... H01L 27/228 |
| 2018/0358546 A1 * | 12/2018 | Yi | .......................... H01L 27/222 |

FOREIGN PATENT DOCUMENTS

WO 2016200510 12/2016

* cited by examiner

*Primary Examiner* — Benjamin Tzu-Hung Liu
(74) *Attorney, Agent, or Firm* — Winston Hsu

(57) ABSTRACT

A method for fabricating semiconductor device includes the steps of first providing a substrate having a magnetic tunnel junction (MTJ) region and an edge region, forming an first inter-metal dielectric (IMD) layer on the substrate, and then forming a first MTJ and a second MTJ on the first IMD layer, in which the first MTJ is disposed on the MTJ region while the second MTJ is disposed on the edge region. Next, a second IMD layer is formed on the first MTJ and the second MTJ.

11 Claims, 2 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance.

Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of first providing a substrate having a magnetic tunnel junction (MTJ) region and an edge region, forming an first inter-metal dielectric (IMD) layer on the substrate, and then forming a first MTJ and a second MTJ on the first IMD layer, in which the first MTJ is disposed on the MTJ region while the second MTJ is disposed on the edge region.

According to another aspect of the present invention, a semiconductor device includes: a substrate having a magnetic tunnel junction (MTJ) region and an edge region; a first inter-metal dielectric (IMD) layer on the substrate; a first MTJ on the MTJ region; a second MTJ on the edge region; and a second IMD layer on the first MTJ and the second MTJ.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
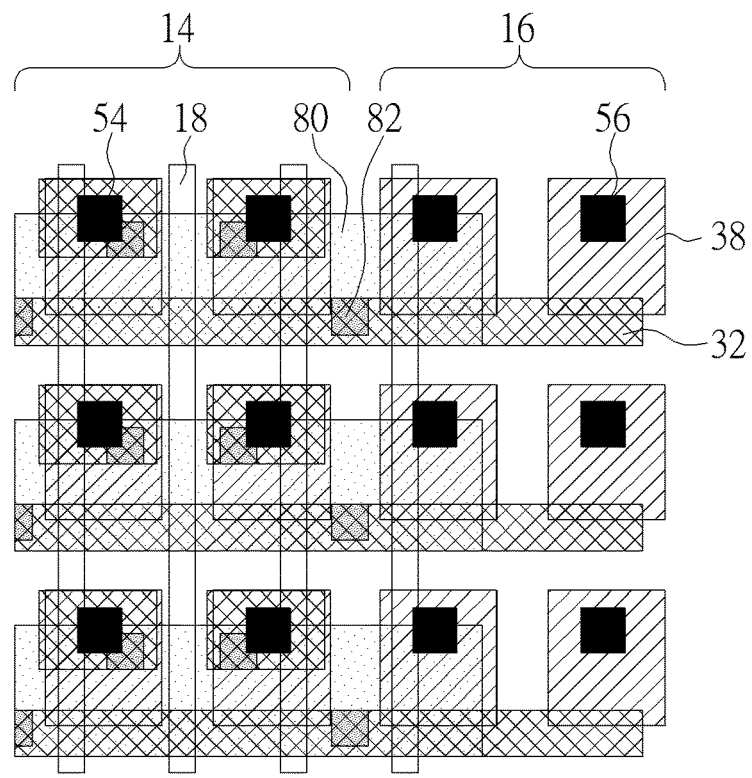
FIG. 1 illustrates a top view of a standard MRAM device according to an embodiment of the present invention.
Figure 2:
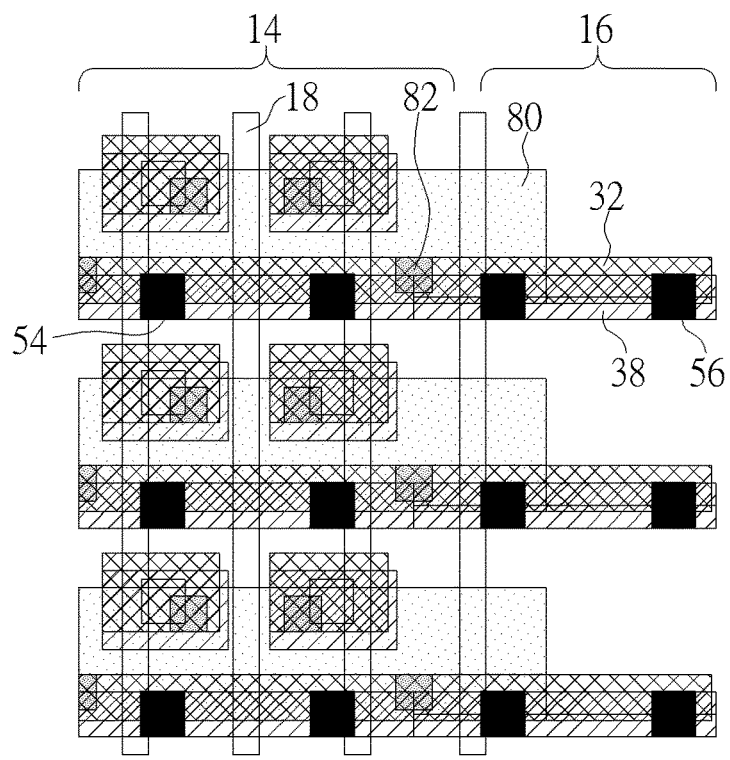
FIG. 2 illustrates a top view of a reverse cell MRAM device according to an embodiment of the present invention.
Figure 3:
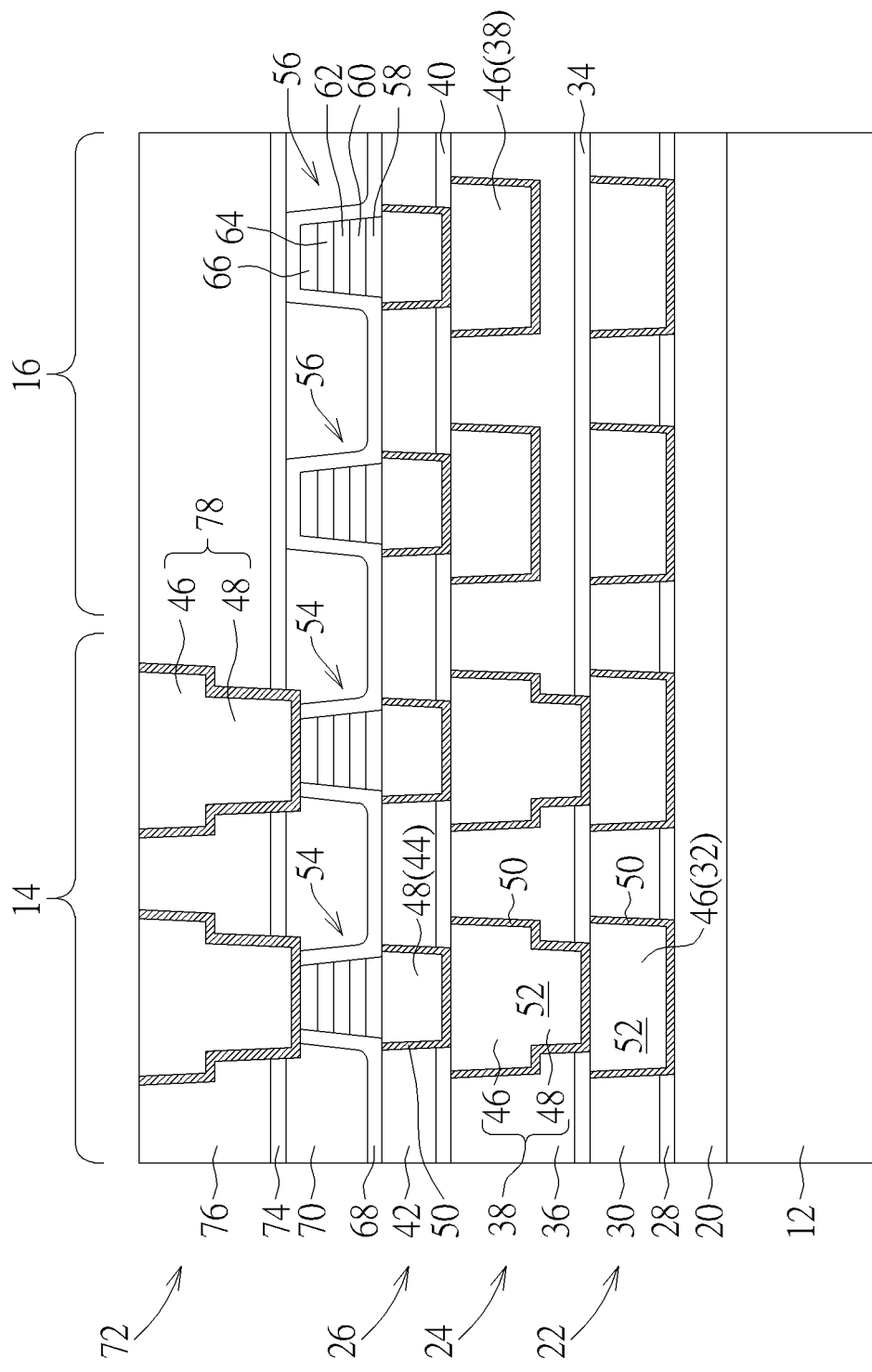
FIG. 3 illustrates a cross-section view of FIG. 1 or FIG. 2 according to an embodiment of the present invention.

Referring to FIGS. 1-3, FIGS. 1-3 illustrate a method for fabricating a semiconductor device, or more specifically a MRAM device according to an embodiment of the present invention, in which FIG. 1 illustrates a top view of a standard MRAM device, FIG. 2 illustrates a top view of a reverse cell MRAM device, and FIG. 3 illustrates a cross-section view of FIG. 1 or FIG. 2. It should be noted that even though most of the devices illustrated in FIG. 1 or FIG. 2 are shown in FIG. 3, FIG. 3 only represents an overall cross-section view of either FIG. 1 or FIG. 2 instead of a cross-section of a specific sectional line of either FIG. 1 or FIG. 2.

As shown in FIGS. 1-3, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and an edge region 16 are defined on the substrate 12.

Active devices such as metal-oxide semiconductor (MOS) transistors, passive devices, conductive layers, and interlayer dielectric (ILD) layer 20 could also be formed on top of the substrate 12. More specifically, planar MOS transistors or non-planar (such as FinFETs) MOS transistors could be formed on the substrate 12, in which the MOS transistors could include transistor elements such as gate structures 18 (for example metal gates) and source/drain region 80, spacer, epitaxial layer, and contact etch stop layer (CESL). The ILD layer 20 could be formed on the substrate 12 and covering the MOS transistors, and a plurality of contact plugs 82 (only shown in FIGS. 1-2) could be formed in the ILD layer 20 to electrically connect to the gate structure and/or source/drain region 80 of MOS transistors. Since the fabrication of planar or non-planar transistors and ILD layer is well known to those skilled in the art, the details of which are not explained herein for the sake of brevity.

Next, metal interconnect structures 22, 24, 26 are sequentially formed on the ILD layer 20 on the MTJ region 14 and the edge region 16 to electrically connect the aforementioned contact plugs 82, in which the metal interconnect structure 22 includes a stop layer 28, an inter-metal dielectric (IMD) layer 30, and metal interconnections 32 embedded in the stop layer 28 and the IMD layer 30, the metal interconnect structure 24 includes a stop layer 34, an IMD layer 36, and metal interconnections 38 embedded in the stop layer 34 and the IMD layer 36, and the metal interconnect structure includes a stop layer 40, an IMD layer 42, and metal interconnections 44 embedded in the stop layer 40 and the IMD layer 42.

In this embodiment, each of the metal interconnections 32 from the metal interconnect structure 22 preferably includes a trench conductor 46 and the metal interconnection 38 from the metal interconnect structure 24 includes a combination of trench conductors and via conductors 48. For instance, each of the metal interconnections 38 on the MTJ region 14 could be made of a combination of trench conductor 46 and via conductor 48 while each of the metal interconnection 38 on the edge region 16 is only made of a trench conductor 46. Each of the metal interconnections 44 within the metal interconnect structure 26 is only made of a via conductor 48.

Preferably, the metal interconnection 32 disposed in the IMD layer 30 on the edge region 16 is optionally disposed such that if no metal interconnection 32 including either trench conductor or via conductor were formed in the IMD layer 30 on the edge region 16, the space directly under the metal interconnection 38 would be free from any barrier underneath.

Preferably, each of the metal interconnections 32, 38, 44 from the metal interconnect structures 22, 24, 26 could be embedded within the IMD layers 30, 36, 42 and/or stop layers 28, 34, 40 according to a single damascene process or dual damascene process. For instance, each of the metal interconnections 32, 38, 44 could further includes a barrier layer 50 and a metal layer 52, in which the barrier layer 50 could be selected from the group consisting of titanium (Ti), titanium nitride (TiN), tantalum (Ta), and tantalum nitride (TaN) and the metal layer 52 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 52 are preferably made of copper, the IMD layers 30, 36, 42 are preferably made of silicon oxide, and the stop layers 28, 34, 40 are preferably made of nitrogen doped carbide (NDC), silicon nitride, silicon carbon nitride (SiCN), or combination thereof.

Next, MTJs 54, 56 are formed on the IMD layer 42 to connect to the metal interconnections 44 individually. In this embodiment, the formation of the MTJs 54, 56 could be accomplished by sequentially forming a first electrode layer 58, a fixed layer 60, a free layer 62, a capping layer 64, and a second electrode layer 66 on the IMD layer 42. In this embodiment, the first electrode layer 58 and the second electrode layer 66 are preferably made of conductive material including but not limited to for example Ta, Pt, Cu, Au, Al, or combination thereof. The fixed layer 60 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 60 is formed to fix or limit the direction of magnetic moment of adjacent layers. The free layer 62 could be made of ferromagnetic material including but not limited to for example iron, cobalt, nickel, or alloys thereof such as cobalt-iron-boron (CoFeB), in which the magnetized direction of the free layer 62 could be altered freely depending on the influence of outside magnetic field. The capping layer 64 could be made of insulating material including but not limited to for example oxides such as aluminum oxide (AlO$_x$) or magnesium oxide (MgO).

Next, a pattern transfer or photo-etching process is conducted by using a patterned resist (not shown) as mask to remove part of the second electrode layer 66, part of the capping layer 64, part of the free layer 62, part of the fixed layer 60, and part of the first electrode layer 58 to form MTJs 54 on the MTJ region 14 and MTJs 56 on the edge region 16, in which each of the MTJs 56, 56 electrically connect or more specifically directly contact the metal interconnections 44 underneath.

Next, a cap layer 68 is formed on the IMD layer 42 to cover the MTJs 54, 56, another IMD layer 70 is formed on the cap layer 68, and a planarizing process such as chemical mechanical polishing (CMP) process is conducted to remove part of the IMD layer 70 and part of the cap layer 68 so that the top surface of the remaining IMD layer 70 is even with the top surface of the cap layer 68. In this embodiment, the cap layer 68 is preferably made of dielectric material such as silicon nitride, but not limited thereto.

Next, another metal interconnect structure 72 following the aforementioned metal interconnect fabrication process is formed on the IMD layer 70 and the MTJs 54, 56, in which the metal interconnect structure 72 includes a stop layer 74, an IMD layer 76, and metal interconnections 78 embedded in the stop layer 74 and the IMD layer 76. It should be noted that the metal interconnections 78 formed on the MTJ region 14 at this stage preferably includes trench conductors 46 and via conductors 48 to electrically connect or more specifically directly contact the MTJs 54 underneath. No metal interconnections however were formed on the edge region 16 to electrically connect the MTJs 56 underneath. This completes the fabrication of a semiconductor device according to an embodiment of the present invention.

Referring again to FIG. 3, FIG. 3 further illustrates a structural view of a semiconductor device according to an embodiment of the present invention. As shown in FIG. 3, the semiconductor device includes metal interconnect structures 22, 24, 26 disposed on the ILD layer 20, MTJs 54, 56 disposed on the metal interconnect structure 26, a cap layer 68 disposed around the MTJs 54, 56, an IMD layer 70 disposed around the cap layer 68, and another metal interconnect structure 72 disposed on the IMD layer 70. It should be noted that the cap layer 68 disposed on the MTJ region 14 is only disposed on sidewalls of the MTJs 54 but not on top surfaces of the MTJs 54. The cap layer 68 disposed on the edge region 16 on the other hand is disposed not only on sidewalls of the MTJs 56 but also on top surfaces of the MTJs 56.

In this embodiment, the metal interconnect structure 22 includes a stop layer 28, an IMD layer 30, and trench conductors 46 embedded in the stop layer 28 and the IMD layer 30, the metal interconnect structure 24 includes a stop layer 34, an IMD layer 36, trench conductors 46 and via conductors 48 embedded in the stop layer 34 and the IMD layer 36 on the MTJ region 14 and trench conductors 46 embedded in the IMD layer 36 on the edge region 16, the metal interconnect structure 26 includes a stop layer 40, an IMD layer 42, and via conductors 48 embedded in the stop layer 40 and the IMD layer 42, and the metal interconnect structure 72 includes a stop layer 74, an IMD layer 76, and trench conductors 46 and via conductors 48 embedded in the stop layer 74 and IMD layer 76 on the MTJ region 14.

Viewing from a more detailed perspective, the bottom surfaces of the MTJs 54 on the MTJ region 14 are electrically connected or more specifically directly contacting the via conductors 48 while the top surfaces of the MTJs 54 are directly contacting the metal interconnections 78. The bottom surfaces of the MTJs 56 on the edge region 16 are also directly contacting the via conductors 48 but the top surfaces of the MTJs 56 are not connected to any metal interconnection. In other words, the top (or topmost) surfaces and sidewalls of the MTJs 56 on the edge region 16 are directly contacting the cap layer 68. It should also be noted that the trench conductors 46 disposed in the IMD layer 30 on the edge region 16 are optional, hence according to an embodiment of the present invention, it would also be desirable to not form any metal interconnection such as trench conductors 46 in the IMD layer 30 on the edge region 16, which is also within the scope of the present invention.

Overall, the present invention preferably forms MTJs on both the MTJ region (or array region) and edge region during the fabrication of MRAM device, in which the MTJs disposed on the edge region preferably serving as dummy MTJs while not electrically connected to other elements. Specifically, even though the bottom surface of the MTJs disposed on the edge region could be connected to other conductive lines such as via conductors, the via conductors or other conductive lines connected to these MTJs on the edge region are not further connected (either electrically or physically) to other conductive lines. Moreover, the top surfaces of the MTJs disposed on the edge region are preferably not connected to other conductors. For instance, the top surfaces and sidewalls of the MTJs disposed on the edge region in the aforementioned embodiment are covered by a cap layer made of silicon nitride. By using this design, it would be desirable to effectively improve the critical dimension uniformity (CDU) of the MRAM devices on the edge region thereby increasing the read window of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate having a magnetic tunnel junction (MTJ) region and an edge region;
    a first inter-metal dielectric (IMD) layer on the substrate;
    a first MTJ on the MTJ region and the first IMD layer;
    a second MTJ on the edge region and the first IMD layer, wherein a top surface of the second MTJ is not connected to any metal interconnection;
    a cap layer on the first MTJ and the second MTJ, wherein the cap layer is conformally disposed on sidewalls of the first MTJ, sidewalls of the second MTJ, and the top surface of the second MTJ and a thickness of the cap layer is less than a thickness of the first MTJ, and the thickness of the cap layer is same perpendicular to a contact surface between the cap layer and the first IMD layer; and
    a second IMD layer on the cap layer, wherein a top surface of the cap layer is even with a top surface of the second IMD layer.

2. The semiconductor device of claim 1, further comprising a first via conductor and a second via conductor in the first IMD layer, wherein the first via conductor is connected to the first MTJ and the second via conductor is connected to the second MTJ.

3. The semiconductor device of claim 1, further comprising a third via conductor on the second IMD layer to connect to the first MTJ.

4. The semiconductor device of claim 1, further comprising:
    a third IMD layer between the first IMD layer and the substrate;
    a metal interconnection in the third IMD layer, wherein the metal interconnection is electrically connect the first MTJ; and
    a trench conductor in the third IMD layer, wherein the trench conductor is electrically connect the second MTJ.

5. The semiconductor device of claim 1, wherein the cap layer comprises silicon nitride.

6. The semiconductor device of claim 1, wherein the thickness of the cap layer is less than half the thickness of the first MTJ.

7. The semiconductor device of claim 1, wherein the cap layer between the first MTJ and the second MTJ comprises a U-shape.

8. The semiconductor device of claim 1, wherein the first MTJ and the second MTJ are square-shaped under top view.

9. The semiconductor device of claim 1, wherein the first MTJ are arranged together in a group under top view.

10. The semiconductor device of claim 1, wherein the first MTJ and the second MTJ are of same shape under top view.

11. The semiconductor device of claim 1, wherein a top surface of the first MTJ and the top surface of the second MTJ are even.

* * * * *